United States Patent
Mathuni et al.

(10) Patent No.: US 7,071,110 B2
(45) Date of Patent: Jul. 4, 2006

(54) PROCESS FOR THE PLASMA ETCHING OF MATERIALS NOT CONTAINING SILICON

(75) Inventors: Josef Mathuni, München (DE); Günther Ruhl, Dorfen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/356,106

(22) Filed: Jan. 31, 2003

(65) Prior Publication Data

US 2003/0143858 A1    Jul. 31, 2003

(30) Foreign Application Priority Data

Jan. 31, 2002  (DE) ............................... 102 04 222

(51) Int. Cl.
 *H01L 21/311*  (2006.01)
(52) U.S. Cl. ...................................... 438/695; 438/720
(58) Field of Classification Search ............... 438/695, 438/696, 720, 721, 742
See application file for complete search history.

(56) References Cited

U.S. PATENT DOCUMENTS

| 5,100,505 A | * | 3/1992 | Cathey, Jr. ............... 438/695 |
| 5,185,058 A | * | 2/1993 | Cathey, Jr. ............... 438/695 |
| 5,273,609 A | * | 12/1993 | Moslehi ................. 158/345.28 |
| 5,679,215 A | * | 10/1997 | Barnes et al. ............... 134/1.1 |
| 5,714,306 A | * | 2/1998 | Komatsu et al. ............. 430/323 |
| 6,124,177 A | * | 9/2000 | Lin et al. ................... 438/305 |
| 6,491,835 B1 | * | 12/2002 | Kumar et al. ................ 216/51 |
| 2003/0003374 A1 | * | 1/2003 | Buie et al. ..................... 430/5 |

OTHER PUBLICATIONS

Van Zant, Microchip Fabrication, 4th ed. McGraw-Hill: New York, 2000, pp. 274-277.*

Abstract of S. S. Georgiev, "The neutralization of sodium ions in plasma-deposited SiO2 layers" Thin Solid Films, 121(4), Nov. 30, 1984, pp. 271-277.*

Abstract of Ullal et al., "Relation between the ion flux, gas phase composition, and wall conditions in chlorine plasma etching of silicon" Journal of Vacuum Science and Technology A 21(3), May 2003, pp. 589-595.*

* cited by examiner

*Primary Examiner*—Jack Chen
(74) *Attorney, Agent, or Firm*—Laurence A. Greenberg; Werner H. Stemer; Ralph E. Locher

(57) ABSTRACT

A process enables plasma etching of materials that do not contain silicon. The process is particularly suitable for the side wall passivation of chromium layers in masks for fabricating semiconductor components. The plasma contains oxygen and/or nitrogen, and at least one silicon-donating compound is introduced into the plasma. This allows efficient passivation of side walls.

7 Claims, 1 Drawing Sheet

PROCESS FOR THE PLASMA ETCHING OF MATERIALS NOT CONTAINING SILICON

BACKGROUND OF THE INVENTION

Field of the Invention

The invention relates to a plasma-etching process using an oxygen-containing and/or nitrogen-containing plasma for side wall passivation.

When materials are being patterned or structured in the semiconductor industry, it is often necessary for certain regions of a structure to be covered by passivation layers during etching processes. The passivation layers are used to protect underlying layers from the etching medium.

This causes a problem in particular during the production of masks that include chromium layers. During the plasma etching of chromium layers in the production of masks (e.g. COG, chrome-on-glass), the chromium layer is usually patterned by way of a plasma etching process. In the present context, the term plasma etching is understood as meaning any process which, from a plasma, effects the removal of material. These include, for example, reactive ion etching (RIE), wherein, in addition to ion bombardment, reactive components of the gas atmosphere used are also active. Reactive ion etching allows in particular anisotropic etching. ICP (inductively coupled plasma) processes are also included in the term plasma etching. Furthermore, combinations of RIE and ICP processes are also possible.

To enable the chromium to be converted into a volatile compound during the etching of chromium masks, relatively large amounts of oxygen have to be added to the etching gas (chlorine). In this case, the high oxygen content in the plasma prevents the formation of polymers with which side wall passivation is otherwise achieved. Furthermore, a resist layer which is used during the patterning of the chromium layer is laterally attacked by the oxygen radicals which are present.

Hitherto, it has been attempted to solve this problem by adjusting the resist-etching rate. The resist-etching rate is partially isotropic, and consequently determines the uniformity of the final dimension (CD uniformity) and the dimension loss (CD bias).

A drawback in this context is that effective flank protection cannot be achieved in this way.

SUMMARY OF THE INVENTION

It is accordingly an object of the invention to provide a plasma-etching method for non-silicon materials which overcomes the above-mentioned disadvantages of the heretofore-known devices and methods of this general type and with which side wall passivation can be achieved in an effective way.

With the foregoing and other objects in view there is provided, in accordance with the invention, a plasma-etching process, which comprises:

providing a quartz substrate with a chromium layer;
generating a plasma containing at least one of oxygen and nitrogen for side wall passivation; and
introducing at least one silicon-donating compound into the plasma; and
etching the chromium layer in a fabrication of a semiconductor component.

In accordance with an added feature of the invention, the at least one silicon-donating compound is a gaseous molecule of the following empirical formula: $SiA_xH_y$, where $x=0, \ldots, 4$;
$y=0, \ldots, 4$; and
$x+y=4$ and
$A=Cl$ or $A=F$.

In accordance with an additional feature of the invention, the at least one silicon-donating compound is a gaseous molecule of $SiH_4$, $SiCl_4$, $SiF_4$, and/or $SiH_2Cl_2$.

The introduction of at least one silicon-donating compound into the plasma allows a reaction with oxygen molecules or ions and/or nitrogen molecules and/or ions which are present in the plasma.

The $SiO_2$ or $SiO_2$-like compounds or nitride compounds which form are uncharged and therefore deposited on the surface of the treated material.

In an advantageous configuration of the invention, at least one silicon-donating compound is a gaseous molecule in accordance with the following empirical formula: $SiA_xH_y$, where $x=0, \ldots, 4$,
$y=0, \ldots, 4$
$x+y=4$ and
$A=Cl$ or $A=F$, in particular $SiH_4$, $SiCl_4$, $SiF_4$ or $SiH_2Cl_2$.

It is advantageous for in each case two hydrogen atoms in one of these silicon-donating compounds to be substituted by an oxygen atom, with $SiCl_2O$ in particular being advantageous, the silicon-donating compound being in gas form under operating conditions.

When a trench structure is being etched in the material, after the at least one silicon-donating compound has been added, a side wall of the trench structure is advantageously coated with an $SiO_2$ layer and/or an $SiO_2$-like layer and/or with a nitride layer for the purpose of side wall passivation. The $SiO_2$ and/or $SiO_2$-like compounds and/or the nitride compounds are detached again from the surfaces which lie transversely with respect to the electric field and on which the ions impinge with a particularly high level of energy, while a passivation layer remains in place on the side walls.

$SiO_2$ layers and/or $SiO_2$-like layers and/or nitride layers which have been deposited on a base of the trench structure are advantageously removed by charged particles in the plasma.

It is also advantageous if the $SiO_2$ layers and/or the $SiO_2$-like layers and/or the nitride layers are removed during cleaning and/or resist stripping of the material.

Other features which are considered as characteristic for the invention are set forth in the appended claims.

Although the invention is illustrated and described herein as embodied in a process for the plasma etching of materials which do not contain silicon, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
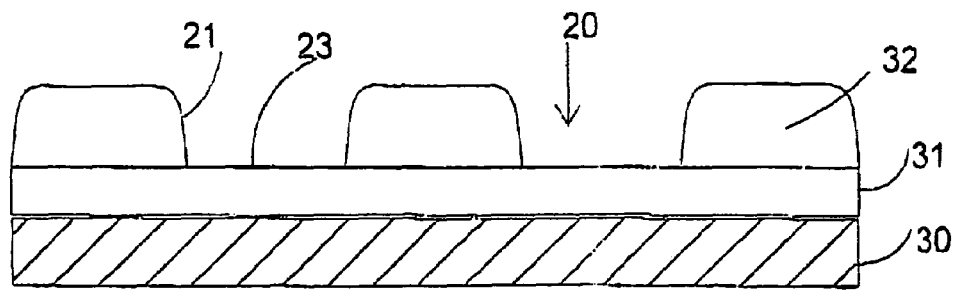
FIG. 1 is a diagrammatic sectional side view of a part of a mask for the fabrication of semiconductor components prior to an etch.

Referring now to the figures of the drawing in detail and first, particularly, to FIG. 1 thereof, there is shown a structure in section, the structure being used in the fabrication of a mask for semiconductor manufacture. FIG. 1 represents the state of the assembly prior to the etch.

In this state, a chromium layer 31 is arranged on a quartz substrate 30. This chromium layer 31 is to be patterned in a plasma-etching process, a resist layer 32 (photoresist) being arranged above parts of the chromium layer. The resist layer 32 has trench structures 20, at which a plasma 10 (cf. FIG. 2) is to etch the chromium layer 31 in order to produce a pattern. Regions of the chromium layer 31 which are covered by the resist layer 32 are not etched.

Figure 2:
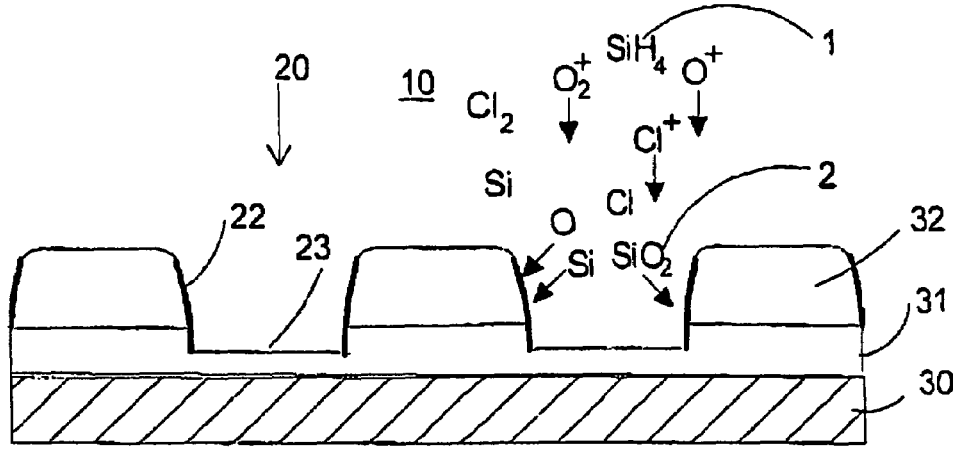
FIG. 2 is a diagrammatic and schematic view of a part of the mask shown in FIG. 1 during an etch using the process according to the invention.

FIG. 2 illustrates the etching operation using the process according to the invention.

According to the invention, the plasma 10 contains a silicon donor, i.e., a silicon-donating compound 1, namely gaseous $SiH_4$. Alternatively, or even additionally, it is also possible to use gaseous $SiCl_4$, $SiF_4$ or $SiH_2Cl_2$ as silicon-donating compounds. Also, each of these silicon-donating compounds 1 can be used on its own in the process according to the invention. In general terms, the molecule of the silicon-donating compound 1 can be built up in accordance with the following empirical formula: $SiA_xH_y$, where x=0, . . . , 4
y=0, . . . , 4 and
x+y=4 and
A=Cl or A=F.

Therefore, chlorine-containing or fluorine-containing silicon compounds are suitable. Alternatively, it is also possible to use gaseous compounds of this nature if two hydrogen atoms are replaced by an oxygen atom, such as for example $SiCl_2O$, provided that the compound is gaseous under the process conditions (silicon dioxide, $SiO_2$ is accordingly ruled out).

Furthermore, the plasma 10 contains uncharged molecules (e.g. $Cl_2O_2$) and ions ($O^+$, $Cl^+$, $O_2^+$). In the present example, the oxygen in the plasma 10 is used as a reaction partner for the silicon during the formation of passivation layers. As an alternative or in addition it is also possible for nitrogen in the plasma 10 to be used as a reaction partner.

The electric field which forms in the plasma perpendicular to the substrate causes the ionized particles to be diverted substantially vertically toward a base 23 of the trench structure 31. This is symbolically indicated in FIG. 2 by arrows at the corresponding ions.

The uncharged particles, in particular the silicon-donors 1, move randomly in the field, i.e. they impinge in particular on the side walls 21 of the trench structure 20. However, some of these particles will also impinge on the base 23 or the top side of the resist layer 32.

The silicon-donating compounds 1 are broken down in the plasma 10, the silicon which is released combining with the oxygen which is present in the plasma 10. Since there is sufficient oxygen in the plasma, small quantities of the silicon-donating compound 1 are sufficient.

$SiO_2$ compounds and/or $SiO_2$-like compounds 2 are formed as a product of the reaction. These are in principle deposited on the top side of the resist layer 32, the side walls 21 of the resist layer 32 and on the base 23.

The ions that are generated in the plasma 10, however, impinge vertically on the top side of the resist layer 32 and the base 23 with an energy which can be adjusted, so that the compounds deposited there comprising $SiO_2$ and/or $SiO_2$-like compounds are removed again in situ. The deposits of $SiO_2$ and/or $SiO_2$-like compounds on the side walls 21, however, are not affected by the vertically impinging ions, since only very small quantities of these ions impinge on the side walls 21, which are likewise substantially vertical. Scattered ions and neutral particles which impinge on the side walls 21 do not have sufficient kinetic energy to effect removal, or the density of the particles is too low. Therefore, the resist is not recessed back, and the etching flank which is produced into the layer of chromium 31 is also protected.

Therefore, the result is the formation of side wall passivation 22 comprising $SiO_2$ and/or $SiO_2$-like compounds on the side walls 21 of the resist layer 32 and on etched regions of the chromium layer 31. This is indicated in FIG. 2 by the thick lines.

Therefore, an anisotropic etch without loss of dimensions is possible.

Typical operating parameters for a plasma etch of this type for chromium layers are:

| | |
|---|---|
| Pressure: | 10 mTorr |
| $Cl_2$ flow: | 20 sccm |
| $O_2$ flow: | 10 sccm |
| He flow: | 40 sccm |
| $SiH_4$ flow: | 2 sccm |
| magnetic flux density: | 0.5 mT |
| RF power: | 50 W |
| ICP power: | 300 W |

The process described can be regarded as a combination of RIE (reactive ion etching) and ICP (inductively coupled plasma) processes.

Figure 3:
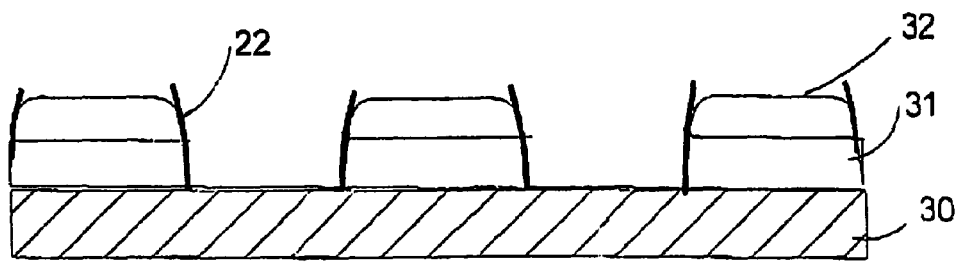
FIG. 3 is a diagrammatic view of the part of the mask shown in FIG. 2 following the etch using the process according to the invention.

FIG. 3 shows the situation after the etching. The chromium layer 31 has been partially etched and patterned. The side walls 21 are covered with a side wall passivation 22.

Figure 4:
FIG. 4 is a diagrammatic view of the part of the mask shown in FIG. 3 after resist stripping and cleaning steps.

FIG. 4 then shows the state after the resist stripping and cleaning. The resist layer 32 and the side wall passivation 22 have been removed. Only the patterned chromium layer 31 remains in place on the quartz substrate 30.

The execution and implementation of the invention is not restricted to the preferred exemplary embodiments described above. Rather, there are a number of conceivable variants which make use of the process according to the invention even in embodiments which are of fundamentally different configuration but which nevertheless incorporate the basic concepts of the novel process.

We claim:

1. A plasma-etching process for the fabrication of a mask used in the fabrication of a semiconductor component, which comprises:

providing a quartz substrate with a chromium layer;
generating an etching plasma containing at least one of oxygen and nitrogen;
introducing at least one silicon-donating compound into the plasma, the silicon-donating compound being a gaseous molecule selected from the group consisting of $SiH_4$, $SiF_4$, $SiH_2Cl_2$, $SiCl_2O$;

etching a trench structure in the chromium layer with the etching plasma; and during the etching step, and after the at least one silicon-donating compound has been added to the plasma, coating the side walls of the trench structure with an $SiO_2$ a layer, an $SiO_2$-like layer, or a silicon nitride layer for the formation of passivation layers.

2. The process according to claim 1, wherein the at least one silicon-donating compound is a gaseous molecule of the formula $SiA_xH_y$, where $x = 0, \ldots, 4$;
$y = 0, \ldots, 4$; and
$x+y = 4$ and
$A = Cl$ or $A = F$.

3. The process according to claim 2, which comprises substituting a pair of two hydrogen atoms with one oxygen atom in the at least one silicon-donating compound of the empirical formula $SiA_xH_y$, while maintaining the silicon-donating compound in gas form under operating conditions.

4. The process according to claim 4, wherein at least one silicon-donating compound has the formula $SiCl_2O$.

5. The process according to claim 1, which comprises reacting the plasma with at least one silicon-donating compound to form compounds selected from the group consisting of uncharged $SiO_2$ compounds, uncharged $SiO_2$-like compounds, and silicon nitride compounds.

6. The process according to claim 5, which comprises removing layers of one of the group consisting of silicon nitride layers, $SiO_2$-like layers, and $SiO_2$ layers, which have been deposited during the etching on a base of the trench structure in the chromium layer on the guartz substrate, by charged particles of the etching plasma.

7. The process according to claim 6, which comprises removing layers selected from the group consisting of silicon nitride layers, $SiO_2$-like layers, and $SiO_2$ layers during one of cleaning and resist stripping of the chromium layer on the quartz substrate.

* * * * *